(12) United States Patent
Park

(10) Patent No.: US 11,600,357 B2
(45) Date of Patent: Mar. 7, 2023

(54) STATIC RANDOM-ACCESS MEMORY (SRAM) FAULT HANDLING APPARATUS AND SRAM FAULT HANDLING METHOD

(71) Applicant: Magnachip Semiconductor, Ltd., Chungcheongbuk-do (KR)

(72) Inventor: Sangsu Park, Chungcheongbuk-do (KR)

(73) Assignee: MAGNACHIP SEMICONDUCTOR, LTD., Chungcheongbuk-do (KR)

( * ) Notice: Subject to any disclaimer, the term of this patent is extended or adjusted under 35 U.S.C. 154(b) by 0 days.

(21) Appl. No.: 17/566,909

(22) Filed: Dec. 31, 2021

(65) Prior Publication Data

US 2022/0336038 A1    Oct. 20, 2022

(30) Foreign Application Priority Data

Apr. 15, 2021   (KR) ................... 10-2021-0049471

(51) Int. Cl.
*G11C 29/00* (2006.01)
*G11C 29/44* (2006.01)
*G11C 29/46* (2006.01)
*G11C 29/18* (2006.01)
*G11C 29/12* (2006.01)

(52) U.S. Cl.
CPC ...... *G11C 29/4401* (2013.01); *G11C 29/1201* (2013.01); *G11C 29/18* (2013.01); *G11C 29/46* (2013.01); *G11C 29/76* (2013.01); *G11C 2029/4402* (2013.01)

(58) Field of Classification Search
CPC . G11C 29/4401; G11C 29/1201; G11C 29/18; G11C 29/46; G11C 29/76; G11C 2029/4402
See application file for complete search history.

(56) References Cited

U.S. PATENT DOCUMENTS

| | | | | |
|---|---|---|---|---|
| 5,263,032 A | * | 11/1993 | Porter | G06F 11/106 |
| | | | | 714/764 |
| 2006/0236165 A1 | * | 10/2006 | Cepulis | G06F 11/1008 |
| | | | | 714/721 |
| 2012/0005403 A1 | * | 1/2012 | Scouller | G06F 11/0763 |
| | | | | 711/E12.001 |

FOREIGN PATENT DOCUMENTS

KR    2008-0010868 A    1/2008

\* cited by examiner

*Primary Examiner* — Christine T. Tu
(74) *Attorney, Agent, or Firm* — Polsinelli PC

(57) ABSTRACT

A fault handling apparatus and a fault handling method which perform a built-in self-test (BIST) and a repair on a static random-access memory (SRAM) cell, and the fault handling apparatus and the fault handling method store the fault and repair history information of a previous SRAM test, provide the information to a current test, and reflect both BIST results and the information on the previous test, thereby performing multiple repairs until there is no available spare SRAM.

26 Claims, 7 Drawing Sheets

STATIC RANDOM-ACCESS MEMORY (SRAM) FAULT HANDLING APPARATUS AND SRAM FAULT HANDLING METHOD

CROSS-REFERENCE TO RELATED APPLICATION

The present application claims the priority of Korean Patent Application No. 10-2021-0049471, filed on Apr. 15, 2021, which is hereby incorporated by reference in its entirety for all purposes.

BACKGROUND

Field of the Disclosure

The present disclosure relates to a static random-access memory (SRAM) fault handling apparatus and an SRAM handling method. Although the present disclosure is suitable for a wide scope of applications, it is particularly suitable for storing repair status and history of fault results in previous tests, so that multiple repairs can be performed by reflecting both a built-in self-test (BIST) result and previous test results until there is no available spare SRAM.

Description of the Background

As a process becomes more detailed, an SRAM cell is increasingly being used, so that the reliability of the SRAM cells becomes important. Also, SRAM cell repair also becomes more important because of the occurrence of "margin fail" that the SRAM cell does not normally operate in accordance with operating conditions (e.g., temperature, voltage, operating frequency, etc.). The margin fail means that when testing is performed multiple times for the same test condition, or at different test conditions, PASS/FAIL results are different at a specific address. Due to test time and cost, a built-in self-test (BIST) and repair are performed on the SRAM cell under specific conditions (e.g., room temperature, low operating voltage, maximum operating frequency, etc.). The test to which other test conditions (e.g., high temperature, etc.) are added if necessary is performed on the SRAM cell. If the margin fail occurs due to the changed test conditions, repair or fault handling must be performed again on the corresponding SRAM chip. As such, when the result of the BIST test shows different fault aspects depending on the test conditions, multi-repair becomes complicated.

When the multi-repair is performed, it must be taken into account that the BIST test result is changed by the margin fail in order to perform the repair of the margin fail. For example, there is a case where a specific address is a good SRAM cell in one test condition and the specific address is a bad SRAM cell in another test condition or, conversely, there is a case where a specific address is a bad SRAM cell in one test condition and the specific address is a good SRAM cell in another test condition. Through the BIST test, only the results of the currently running test can be known, while the results of a previous test cannot be known. Thus, in the multi-repair, fault history information and a repair state of a spare address for a previous test must be provided and a non-volatile storage for storing them is required.

In the past, a test is performed mainly for the purpose of "hard fault" detection only. That is, the margin fail has an aspect which varies depending on test conditions, and because of the complexity of the multi-repair, repair is performed only once under the worst condition in the prior art. When a fault occurs in the SRAM cell in the further performed test, fault handling is performed on the chip. However, as the reliability of the SRAM cell becomes important by that the process becomes more detailed, the test is further performed for other test conditions. Here, in the case of the occurrence of the margin fail (i.e., a fault occurs depending on a condition), unless the multi-repair is supported, fault handling must be performed on the chip even though there are spare available SRAMs. There is a method of reading repair information directly in a test apparatus and performing the repair. However, this method makes test programs of the device complicated when several chips are tested simultaneously, and support may be impossible depending on the device. This reduces test efficiency and has a direct impact on yield.

Also, there is a method in which when the device is powered on, a BIST circuit is operated to store, in a register, a fault address of a real memory area and a normal address of a spare memory area with respect to the test result and when a write/read operation is performed on the fault real address by the actual operation of the device, the fault real address is replaced with a normal spare address and the write/read operation is performed on the SRAM. This has an advantage that there is no need for additional non-volatile storage because remapping is made through the register that stores the fault real address and the normal spare address. However, in such a method, if the operating environment during the BIST operation and the operating environment during the actual operation (e.g., temperature, voltage, operating frequency, etc.) are not the same, the margin fail may occur. When, on the basis of the SRAM cell, the device is powered on in a good operating environment and the BIST operation is finished and the operating environment is changed to a poor operating environment in the actual operation, there is a possibility of the occurrence of the fault in the SRAM, which may affect reliability. Also, in this method, it may not be easy to change the operating condition of the BIST such as to lower the SRAM operating voltage during an interval in which the BIST is performed, or to rapidly control the operating frequency used in the BIST. Also, when the SRAM fault aspect varies depending on the test conditions, margin fail may occur because a history of fault results of a previous test cannot be obtained.

As described above, in the past, when an SRAM cell test is performed, a history of fault results of a previous test is not obtained even though repair is performed on a fault address, so that it is not possible to deal with the margin fail.

The above information disclosed in this Background section is only for enhancement of understanding of the background of the described technology and therefore it may contain information that does not form prior art that is already known to a person of ordinary skill in the art.

SUMMARY

Accordingly, the present disclosure is directed to a static random-access memory (SRAM) fault handling apparatus and a SRAM fault handling method that substantially obviate one or more of problems described above.

In order to solve such problems, the present disclosure is to provide a method which stores a repair state and fault history information of the spare address for a previous test, reflects both the BIST test result and the information on the previous test, and performs multiple-repair until there is no spare available SRAM.

According to the present disclosure, a static random-access memory (SRAM) fault handling apparatus is provided. The SRAM may include a real memory area and a spare memory area. The SRAM fault handling apparatus may comprises: a memory unit which stores repair information; a command map which obtains the repair information of a previous test from the memory unit and provides the repair information of the previous test; a built-in self-test (BIST) block unit which obtains the repair information of the previous test from the command map, performs a fault test on entire address of a SRAM cell, distinguishes whether a fault address where a fault has occurred is an address of the real memory area (real address) or an address of the spare memory area (spare address), and stores fault address information related to the fault address; an update unit which updates the fault address information by using the repair information of the previous test obtained from the command map and the fault address information obtained from the BIST block unit; and a remapping control unit which updates the repair information by remapping the repair information based on the repair information of the previous test and the updated fault address information obtained from the update unit, and transmits the updated repair information to the command map, wherein the command map obtains the updated repair information and stores in the memory unit.

Further, the BIST block unit stores the fault address information in a fault real address unit when the fault address is the real address, or stores the fault address information in a fault spare address unit when the fault address is the spare address.

Further, the BIST block unit excludes, from the fault test, an address which has been already repaired among the real address based on the repair information of the previous test obtained from the command map, and performs the fault test on the repaired and replaced spare address.

Further, the update unit stores the repair information of the previous test obtained from the command map in a repair information register of the update unit, stores the fault address information of the fault real address unit in an updated fault real address unit, and stores the fault address information of the fault spare address unit in an updated fault spare address unit.

Further, the repair information for each of the spare address comprises a repair state showing one of a repaired state, an available state, a failed state, and a canceled state; and a value of an original address which is a real address repaired by the each of the spare address.

Further, when the repair state of the spare address obtained from the command map is in the repaired state and the spare address is present in the fault spare address unit, the update unit stores the value of the original address of the spare address in the updated fault real address unit, and when the repair state of the spare address obtained from the command map is in the repaired state and the spare address is not present in the fault spare address unit, the update unit stores the spare address in the updated fault spare address unit.

Further, when the repair state of the spare address obtained from the command map is in either the failed state or the canceled state and the spare address is not present in the fault spare address unit, the update unit stores the spare address in the updated fault spare address unit.

Further, when the number of the fault addresses stored in the updated fault real address unit is less than or equal to the number of the available addresses calculated based on the number of the fault addresses stored in the updated fault spare address unit, the update unit determines that the repair is possible.

Further, the remapping control unit updates the repair information by remapping each of the spare address in order to repair the fault real address in the updated fault real address unit based on the updated fault real address information obtained from the updated fault real address unit and the updated fault spare address information obtained from the updated fault spare address unit and the repair information of the previous test of the spare address obtained from the repair information register of the update unit and transmits the updated repair information to the command map.

Further, when the spare address is present in the updated fault spare address unit, the repair state of the spare address is in the repaired state and the value of the original address of the spare address is present in the updated fault real address unit, the remapping control unit changes the repair state of the spare address into the canceled state, and when the spare address is present in the updated fault spare address unit and the repair state of the spare address is in the repaired state and the value of the original address of the spare address is not present in the updated fault real address unit, the remapping control unit maintains the repair state of the spare address as the repaired state.

Further, when the spare address is present in the updated fault spare address unit and the repair state of the spare address is in the available state, the remapping control unit changes the repair state of the spare address into the failed state in the command map, when the spare address is present in the updated fault spare address unit and the repair state of the spare address is in the failed state, the remapping control unit maintains the repair state of the spare address as the failed state in the command map, and when the spare address is present in the updated fault spare address unit and the repair state of the spare address is in the canceled state, the remapping control unit maintains the repair state of the spare address as the canceled state in the command map.

Further, when the spare address is not present in the updated fault spare address unit and the updated fault real address is a valid address within a range of the real address, the remapping control unit changes the repair state of the spare address into the repaired state in the command map, and records the updated fault real address in the original address, and when the spare address is not present in the updated fault spare address unit and the updated fault real address is an invalid address outside the range of the real address, the remapping control unit maintains the repair state of the spare address as the available state in the command map.

Further, the SRAM fault handling apparatus may further comprises an address remapping table which outputs a normal spare address replaced for the fault real address, when performing a SRAM write/read access based on the repair information of the previous test or the updated repair information from the command map.

According to the present disclosure, a method in which a static random-access memory (SRAM) test apparatus handles a fault of the SRAM comprising a real memory area and a spare memory area, the SRAM fault handling method may comprise reading repair information of a previous test stored in a memory unit; providing the repair information of the previous test to a built-in self-test (BIST) circuit; performing a fault test on entire address of a SRAM cell by the BIST circuit; when a fault occurs during the fault testing, distinguishing whether a fault address where the fault has occurred is an address of the real memory area (real address) or an address of the spare memory area (spare address), and storing fault address information related to the fault address; updating the fault address information by using the fault address information and the repair information of the previous test; updating the repair information based on the updated fault address information and the repair information of the previous test and transmit the updated repair information to a command map; and storing the updated repair information in the memory unit.

Further, the storing of the fault address information may comprise storing the fault address information in a fault real address unit when the fault address is the real address; and storing the fault address information in a fault spare address unit when the fault address is the spare address.

Further, the performing of the fault test comprises excluding, from the fault test, an address which has been already repaired among the real address in the previous test based on the repair information of the previous test, and performing the fault test on the repaired and replaced spare address.

Further, the updating of the fault address information may comprise storing the repair information of the previous test in the command map of a remapping unit; storing the fault address information of the fault real address unit in an updated fault real address unit, and storing the fault address information of the fault spare address unit in an updated fault spare address unit; checking whether the repair is possible or not by comparing the number of the fault address information of the fault real address unit and the number of the fault address information of the fault spare address unit; and updating the updated fault real address unit and the updated fault spare address unit by using the repair information of the previous test, the fault address information in the fault real address unit, and the fault address information in the fault spare address unit.

Further, the repair information for each of the spare address may comprise a repair state showing one of a repaired state, an available state, a failed state, and a canceled state; and a value of an original address which is a real address repaired by the each of the spare address.

Further, the updating of the updated fault real address unit and the updated fault spare address unit may comprise when the repair state of the spare address to be updated is in the repaired state and the spare address is present in the fault spare address unit, storing the value of the original address of the spare address in the updated fault real address unit; and when the repair state of the spare address to be updated is in the repaired state and the spare address is not present in the fault spare address unit, storing the spare address in the updated fault spare address unit.

Further, the updating of the updated fault real address unit and the updated fault spare address unit may comprise when the repair state of the spare address to be updated is in either the failed state or the canceled state and the spare address is not present in the fault spare address unit, storing the spare address in the updated fault spare address unit.

Further, the checking whether the repair is possible or not comprises determining that the repair is possible when the number of the fault addresses stored in the fault real address unit is less than or equal to the number of available addresses calculated based on the number of the fault addresses stored in the fault spare address unit.

Further, the updating of the repair information may comprise reviewing from a start address of the spare address; obtaining the fault real address from the updated fault real address unit; and updating the repair information by remapping each of the spare address in order to repair the fault real address based on the repair information of the previous test of the spare address and the updated fault spare address information obtained from the updated fault spare address unit.

Further, the remapping of the each of the spare address may comprise when the spare address is present in the updated fault spare address unit, the repair state of the spare address is in the repaired state and the value of the original address of the spare address is present in the updated fault real address unit, changing the repair state of the spare address into the canceled state; and when the spare address is present in the updated fault spare address unit, the repair state of the spare address is in the repaired state and the value of the original address of the spare address is not present in the updated fault real address unit, maintaining the repair state of the spare address as the repaired state.

Further, the remapping of each of the spare address may comprise, when the spare address is present in the updated fault spare address unit and the repair state of the spare address is in the available state, changing the repair state of the spare address into the failed state, when the spare address is present in the updated fault spare address unit and the repair state of the spare address is in the failed state, maintaining the repair state of the spare address as the failed state; and when the spare address is present in the updated fault spare address unit and the state of the spare address is in the canceled state, maintaining the repair state of the spare address as the canceled state.

Further, the remapping of each of the spare address may comprise when the spare address is not present in the updated fault spare address unit and the fault real address obtained from the updated fault real address unit is a valid address within a range of the real address, changing the repair state of the spare address into the repaired state and recording the fault real address as the value of the original address; and when the spare address is not present in the updated fault spare address unit and the fault real address obtained from the updated fault real address unit is an invalid address outside the range of the real address, maintaining the repair state of the spare address as the available state.

Further, The method may further comprise outputting a normal spare address repaired the fault real address, when performing a SRAM write/read, based on the updated repair information or the repair information of the previous test.

Various aspects of the present disclosure may provide an SRAM fault handling apparatus and method capable of repairing margin fail.

Also, it is also possible to provide the SRAM fault handling apparatus and method for performing a BIST by reflecting a repair state and fault history information of a spare address for a previous test.

Also, it is also possible to provide the SRAM fault handling apparatus and method for generating updated fault address information by reflecting the repair state and fault history information for the previous test.

Also, it t is also possible to provide the SRAM fault handling apparatus and method for performing remapping by reflecting the repair state and fault history information for the previous test.

Also, when a fault occurs in the spare address in a specific test condition, it is possible to provide the SRAM fault handling apparatus and method which store fault information of the spare address, thereby preventing the address from being used.

Also, when a fault occurs in a repaired spare address in a specific test condition, it is possible to provide the SRAM fault handling apparatus and method which store fault information of the spare address to cancel the existing repair and assign the information to another spare address.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
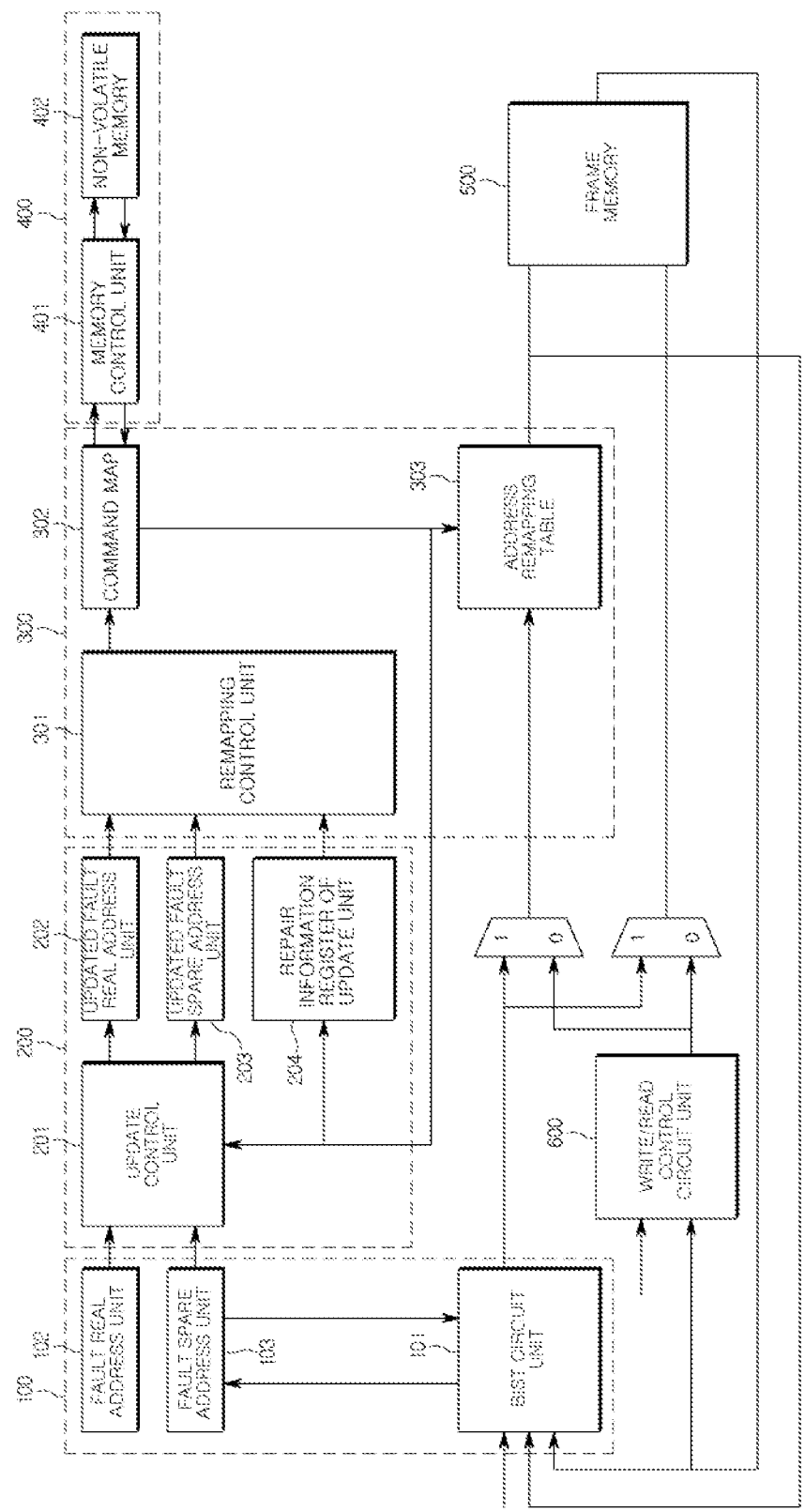
FIG. 1 shows a configuration of an SRAM cell test apparatus according to the present disclosure.

Reference will now be made in detail to the aspects of the present disclosure, examples of which are illustrated in the accompanying drawings. The same or similar elements are denoted by the same reference numerals irrespective of the drawing numerals, and repetitive description thereof may be omitted.

A suffix "module" or "part" for the component, which is used in the following description, is given or mixed in consideration of only convenience for ease of specification, and does not have any distinguishing meaning or function per se. Also, the "module" or "part" may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some aspects of the present disclosure may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the record medium may be resident within an application specific integrated circuit (ASIC). The ASIC may be resident within a user's terminal.

While terms including ordinal numbers such as the first and the second, etc., can be used to describe various components, the components are not limited by the terms mentioned above. The terms are used only for distinguishing between one component and other components.

In the case where a component is referred to as being "connected" or "accessed" to another component, it should be understood that not only the component is directly connected or accessed to the other component, but also there may exist another component between them. Meanwhile, in the case where a component is referred to as being "directly connected" or "directly accessed" to another component, it should be understood that there is no component therebetween.

First, terms used in this specification will be described in brief.

A static random-access memory (SRAM) is a type of a semiconductor memory and can preserve continuously contents as long as power is supplied to the memory. According to the present disclosure, the SRAM can be used to store a still image frame data for displaying on a screen in a display. Here, the SRAM may be composed of an SRAM cell (hereinafter, referred to as a real address) within a range of an address that a display driver IC actually uses and an SRAM cell (hereinafter, referred to as a spare address) within a range of an address which is added as a spare and is used to replace when a fault occurs in the real address.

A built-in self-test (BIST) is a mechanism which can test each memory cell of the SRAM. The BIST can perform a fault test on one cell by generating a background pattern and writing the background pattern on a cell or an address to be tested and then reading and comparing it. The BIST may be embedded in the SRAM.

A fault real address means an address determined as a fault address because it does not pass the BIST in a real address area. A fault spare address means an address determined as a fault address because it does not pass the BIST in a spare address area.

With respect to a repair state of the spare address, "Available" means that the spare address is "in an available state" in order for the corresponding spare address to replace the fault real address. "Repaired" means the spare address is "in a repaired state" where the corresponding spare address has replaced the fault real address. "Failed" means that the spare address is "in a failed state". "Canceled" means that a fault occurs while the spare address is replaced and used, so that the spare address is "in a canceled state".

FIG. 1 shows a configuration of an SRAM cell test apparatus according to the present disclosure.

Referring to FIG. 1, the SRAM cell test apparatus of the present disclosure may include a BIST block unit 100, an update unit 200, a remapping unit 300, and a memory unit 400.

The BIST block unit 100 may include a BIST circuit unit 101, a fault real address unit 102, and a fault spare address unit 103.

When a fault occurs in the SRAM cell within a range of the real address, the BIST circuit unit 101 can store a corresponding fault real address in the fault real address unit 102. When a fault occurs in the SRAM cell within a range of the spare address, the BIST circuit unit 101 can store a corresponding fault spare address in the fault spare address unit 103. The BIST circuit unit 101 may not store redundantly if the corresponding fault address is already present in the fault real address unit 102 or the fault spare address unit 103. Also, the BIST circuit unit 101 reflects repair information of a previous test provided from the remapping unit 300 during the test, so that the fault real address repaired in the previous test is excluded from the test, and the spare address replaced by the repair can be tested instead of the corresponding fault real address. As a result, the BIST circuit unit 101 can prevent redundant repair for the fault real address.

The update unit 200 may include an update control unit 201, an updated fault real address unit 202, an updated fault spare address unit 203, and a repair information register of the update unit 204.

The update control unit 201 can update the updated fault real address unit 202 and the updated fault spare address unit 203 by reflecting the repair information of the previous test received from the remapping unit 300 and the fault address information received from the BIST block unit 100.

The remapping unit 300 may include a remapping control unit 301, a command map 302, and an address remapping table 303.

The remapping control unit 301 may update the repair information by using the updated fault real address unit 202, the updated fault spare address unit 203, and the information of the repair information register of the update unit 204, and record the updated repair information in a repair information field register on the command map 302.

The command map 302 may have a repair information field for showing the repair information for each spare address, and may store the repair information field for each spare address in the repair information field register.

Items and contents for the repair information field are as shown in Table 1.

TABLE 1

| Repair information field | Description |
| --- | --- |
| Failed | When a fault occurs at the corresponding spare address, the repair information field is designated as 1. |
| Valid | When the corresponding spare address is replaced and used, the repair information field is designated as 1. |
| Address | A real address where "Failed" has occurred in a real memory area is designated. The corresponding spare address is used instead of the designated fault real address unit only when Failed = 0 and Valid = 1. |

Also, the repair state is determined by the values of "Failed" and "Valid" in the repair information field, and the contents are as shown in Table 2.

TABLE 2

| Repair state | Failed | Valid | Address | Description |
| --- | --- | --- | --- | --- |
| Available | 0 | 0 | 0 | The corresponding spare address is available. |
| Repaired | 0 | 1 | Fault real address | The corresponding spare address is already replaced and used. |
| Failed | 1 | 0 | 0 | The corresponding spare address is failed. |
| Canceled | 1 | 1 | Fault real address | A fault occurs while the spare address is replaced and used, so that the spare address is canceled. |

The repair information for each spare address stored in the command map 302 may be stored in a nonvolatile memory 402 via a memory control unit 401. The command map 302 may read the repair information stored in a non-volatile memory 402 and store it in the repair information field register when the display driver IC is powered on or performs an operation.

The address remapping table 303 may provide the BIST circuit unit 101 with the repair information including the fault real address and the spare address which has replaced the fault real address, on the basis of the repair information stored in the repair information field register of the command map 302.

Further, the address remapping table 303 may receive the updated repair information or the repair information obtained during the SRAM test from the command map 302 and output a normal spare address replaced for the fault real address during a SRAM write/read operation, so that actual data can be written or read to the replaced normal spare address for the fault real address of the SRAM.

Figure 2:
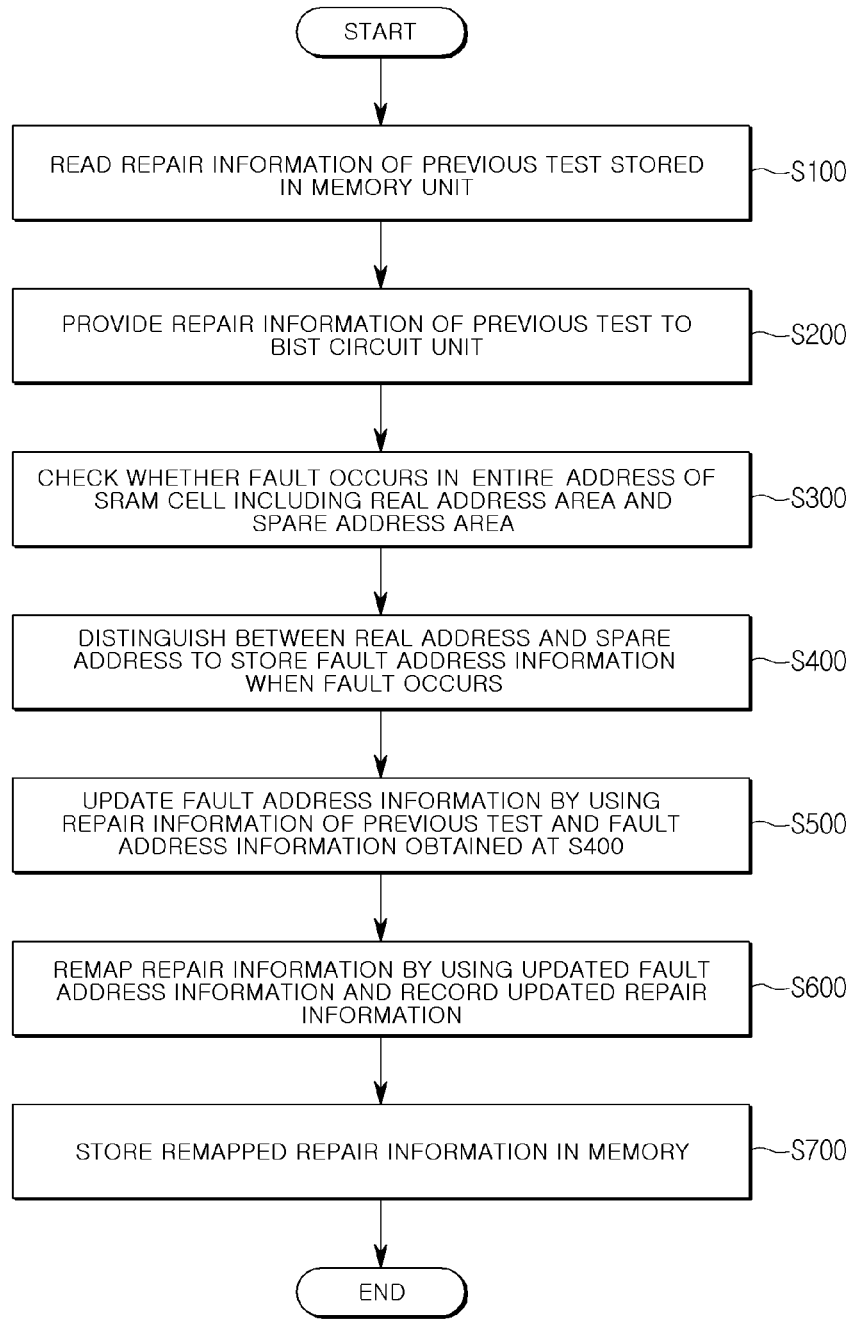
FIG. 2 is a flowchart of a SRAM fault test method of a proposed SRAM test apparatus according to the present disclosure.

FIG. 2 is a flowchart of a SRAM fault test method of a proposed SRAM test apparatus according to the present disclosure.

The SRAM test method may include operations performed by the configuration of the SRAM test apparatus shown in FIG. 1.

The command map 302 may read the repair information of the previous test stored in the memory unit 400 (S100).

The address remapping table 303 may provide the repair information of the previous test read by the command map 302 to the BIST circuit unit 101 (S200).

The BIST circuit unit 101 may test an entire address of the SRAM cell including the real address area and the spare address area (S300).

The BIST circuit unit 101 reflects the repair information of the previous test provided from the address remapping table 303 during the test, so that the fault real address repaired in the previous test is excluded from the test, and the spare address replaced by the repair can be tested instead of the corresponding fault real address. As a result, the BIST circuit unit 101 can prevent redundant repair for the fault real address.

When a fault occurs during the test, the BIST circuit unit 101 may distinguish between the real address and the spare address to store corresponding fault address information (S400 shown in FIG. 2).

When a fault occurs in the SRAM cell within the range of the real address, the BIST circuit unit 101 can store a corresponding fault real address in the fault real address unit 102. When a fault occurs in the SRAM cell within the range of the spare address, the BIST circuit unit 101 can store a corresponding fault spare address in the fault spare address unit 103. The BIST circuit unit 101 may not store redundantly if the corresponding fault address is already present in the fault real address unit 102 or the fault spare address unit 103.

Figure 3:
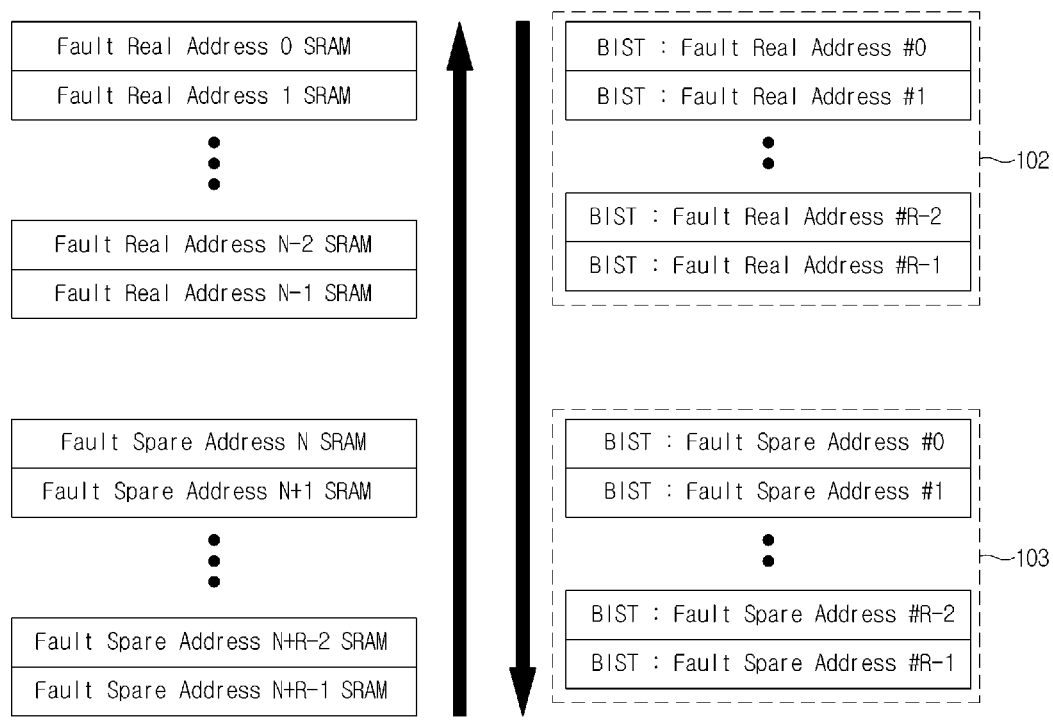
FIG. 3 shows a memory structure in which a fault address detected by an operation of a BIST circuit unit 101 is divided into a real memory area or a spare memory area and stored in a fault real address unit 102 or a fault spare address unit 103 according to the present disclosure.

FIG. 3 shows a memory structure in which a fault address detected by an operation of the BIST circuit unit 101 is divided into a real memory area or a spare memory area and stored in the fault real address unit 102 or the fault spare address unit 103 according to the present disclosure.

The BIST circuit unit 101 can check whether or not a fault occurs for all the addresses (fault real addresses 0 to N−1, fault spare addresses N to N+R−1) of the SRAM cell. When a fault occurs at a specific address within the range of the real address (0 to N−1), the BIST circuit unit 101 may store the address in the fault real address unit 102. However, if the corresponding address is already present in the fault real address unit 102, the BIST circuit unit 101 may not store it redundantly. Similarly, when a fault occurs at a specific address within the range of the spare address (N to N+R−1), the BIST circuit unit 101 may store the address in the fault spare address unit 103. If the corresponding address is already present in the fault spare address unit 103, the BIST circuit unit 101 may not store it redundantly. If there are R number of the spare addresses, it is sufficient if the depths of the fault real address unit 102 and the fault spare address unit 103 are also R. Also, it is sufficient if the command map 302 has the repair information field register for R number of the spare addresses. If a larger number than R of faults occur, the corresponding SRAM may be discarded because all the fault cells cannot be repaired.

Table 3 shows the repair information of the repair information field register of the previous test stored in the command map 302 and examples of results stored in the fault real address unit 102 and the fault spare address unit 103 of the BIST block unit 100 and values of the repair information field register stored in the command map 302 after the operation of BIST circuit unit 101 is completed, according to the present disclosure. Here, the updated fault real address unit 202 and the updated fault spare address unit 203 may be initialized.

aspect of Table 3, according to the value stored in the repair information field register, the spare addresses 100, 102, and 103 are in the "Repaired" state (which means that they have already been replaced and used), the spare addresses 101 and 106 are in the "Failed" state (which means that a fault has occurred at the corresponding spare address through the previous BIST test), and the spare addresses 104, 105, 107 are in the "Available" state (which means they are available spare addresses). In the aspect, an address 127 is assumed to be an unused address and is considered as an invalid address. Thus, since the entire address range is from 0 to 107, the address is represented by a 7-bit address. Also, the address 127 (binary number 1111111) is an unused address, so it can be designated and used as an invalid address in order to distinguish it from a valid address. According to another aspect, when the entire address range is from 0 to 127, the address is represented by an 8-bit address to which one bit is added, and an address 255 (binary 11111111) can be used as an invalid address. As a result, it is possible to check whether the address is valid only by the address value itself stored in the address unit.

If a fault address does not occur when the BIST circuit unit 101 operates in the second or more tests, this means that the repair performed in the previous test is valid. When a fault address appears as shown in the example of Table 3 (e.g., the real address 90 and the spare addresses 102, 105, and 101), it is necessary to perform a repair on additional faults. Therefore, a step of reflecting both the BIST test result and the repair information on the command map 302.

The update control unit 201 may update fault address information by reflecting the repair information of the previous test received from the command map 302 and the fault address information received from the BIST block unit 100 (S500 shown in FIG. 2).

Figure 4:
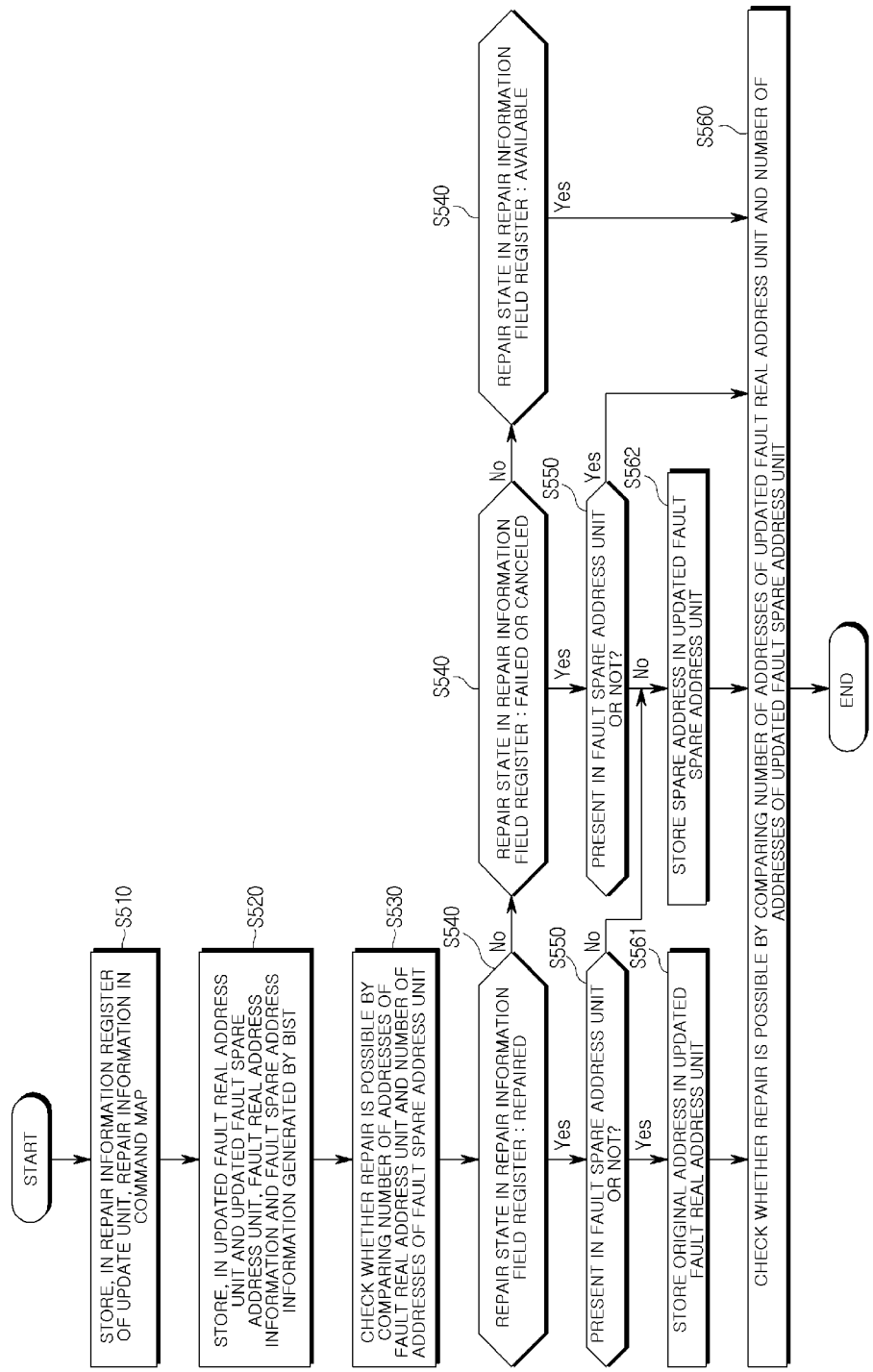
FIG. 4 is a flowchart showing an operation in which an update control unit updates the fault address according to the present disclosure.

FIG. 4 is a flowchart showing an operation in which the update control unit 201 updates the fault address according to the present disclosure.

The update control unit 201 may generate the updated fault real address unit 202 and the updated fault spare

TABLE 3

| Repair information field register of command map 302 | | | | | Fault real address unit 102 | | Fault spare address unit 103 | | Updated fault real address unit 202 | | Updated fault spare address unit 203 | |
|---|---|---|---|---|---|---|---|---|---|---|---|---|
| Spare address | Repair state | Failed | Valid | Address | Entry | Address | Entry | Address | Entry | Address | Entry | Address |
| 100 | Repaired | 0 | 1 | 45 | 0 | 90 | 0 | 102 | 0 | 127 | 0 | 127 |
| 101 | Failed | 1 | 0 | 0 | 1 | 127 | 1 | 105 | 1 | 127 | 1 | 127 |
| 102 | Repaired | 0 | 1 | 12 | 2 | 127 | 2 | 101 | 2 | 127 | 2 | 127 |
| 103 | Repaired | 0 | 1 | 20 | 3 | 127 | 3 | 127 | 3 | 127 | 3 | 127 |
| 104 | Available | 0 | 0 | 0 | 4 | 127 | 4 | 127 | 4 | 127 | 4 | 127 |
| 105 | Available | 0 | 0 | 0 | 5 | 127 | 5 | 127 | 5 | 127 | 5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

In the aspect of Table 3, the range of the real address is 0 to 99, and the range of the spare address is 100 to 107. Since there are eight spare addresses, the depths of the fault real address unit 102 and the fault spare address unit 103 are also eight, and the command map 302 may have the repair information field for the eight spare addresses. The information of the fault real address unit 102 and the fault spare address unit 103 relates to the result of the current test of the BIST circuit unit 101, and the information of the repair information field register of the command maps 302 shows the repair information of the previous test. Referring to the address unit 203 by using the repair information of the previous test of the repair information field register of the command map 302 and the information of the fault real address unit 102 and the fault spare address unit 103 of the BIST block unit 100 for the current test.

The update unit 200 may store, in the repair information register of the update unit 204, the repair information of the previous test stored in the command map 302 (S510). When the remapping unit 300 performs an automatic remapping operation, if the remapping unit 300 changes the repair information on the command map 302 while using the repair information on the command map 302, the existing repair information is changed into repair information updated in the middle, and thus, affects the automatic remapping operation. Therefore, in order to prevent this, the repair information of the previous test can be stored and used in isolated the repair information register of the update unit 204.

The update unit 200 may store, in the updated fault real address unit 202 and the updated fault spare address unit 203, the fault real address information and the fault spare address information generated through the test in the BIST block unit 100 (S520). According to the aspect, the fault real address information and the fault spare address information may be stored in the fault real address unit 102 and the fault spare address unit 103.

The update unit 200 can check whether or not the repair is possible by comparing the number of the fault addresses stored in the fault real address unit 102 and the number of the fault addresses stored in the fault spare address unit 103 (S530). The repair is possible when the number of the fault addresses stored in the fault real address unit 102 is less than or equal to a value obtained by subtracting the number of the fault addresses stored in the fault spare address unit 103 from the total depth of the fault spare address unit 103 (=the total number of the spare addresses), that is, the number of available addresses of the fault spare address unit 103.

The repair information of the previous test can be reflected in the updated fault real address unit 202 and the updated fault spare address unit 203 by sequentially accessing the repair information of the repair information field register on the command map 302 for the entire spare address.

spare address, in the updated fault real address unit 202 (S561). The stored original address information is a real address where a fault has occurred in the real memory area and the stored original address information can be assigned to available another spare address.

When the repair state of the repair information field register on the command map 302 for the spare address is the "Repaired", "Failed", or "Canceled" state and the spare address is not present in the fault spare address unit 103 of the BIST block unit 100, the update control unit 201 may store the spare address in the updated fault spare address unit 203 (S562). With regard to this, since the spare address has been used for repair (Repaired), a fault has occurred (Failed) or the repair has been canceled (Canceled), the corresponding spare address can be stored in the updated fault spare address unit 203 in order not to be used in the next repair.

When the repair state of the repair information field register on the command map 302 for the spare address is in the "Failed" or "Canceled" state and the spare address is present in the fault spare address unit 103 of the BIST block unit 100, the update control unit 201 may not operate additionally ("NOP" in Table 4).

When the repair state of the repair information field register on the command map 302 for the spare address is in the "Available" state, the update control unit 201 may not operate additionally ("NOP" in Table 4).

After the update unit 200 reflects all repair information of the repair information field register on the command map 302 for the fault real address unit 102, the fault spare address unit 103, and the entire spare address, the update unit 200 can check again whether the repair is possible on the basis

TABLE 4

| Repair information field register of the command map 302 | | | Fault spare address unit 103 | Update control unit 201 |
|---|---|---|---|---|
| Repair state | Failed | Valid | Presence | Operation |
| Available | 0 | 0 | 0 | NOP |
| Available | 0 | 0 | 1 | NOP |
| Repaired | 0 | 1 | 0 | The spare address is stored in the updated fault spare address unit 203. |
| Repaired | 0 | 1 | 1 | A value of an original address is stored in the updated fault real address unit 202. |
| Failed | 1 | 0 | 0 | The spare address is stored in the updated fault spare address unit 203. |
| Failed | 1 | 0 | 1 | NOP |
| Canceled | 1 | 1 | 0 | The spare address is stored in the updated fault spare address unit 203. |
| Canceled | 1 | 1 | 1 | NOP |

Table 4 shows operations of the update control unit 201 according to the repair information of the repair information field register on the command map 302 for the spare address and according to whether or not the spare address is present in the fault spare address unit 103 according to the present disclosure.

The update control unit 201 can check the repair state of the repair information field register on the command map 302 for the spare address (S540). The update control unit 201 can check whether or not the corresponding spare address is present in the fault spare address unit 103 (S550).

When the repair state of the repair information field register on the command map 302 for the spare address is in the "Repaired" state and the spare address is present in the fault spare address unit 103, the update control unit 201 may store a value of the "Address" (original address) of the repair information field register on the command map 302 for the of the number of the update fault addresses stored in the updated fault real address unit 202 and the number of the update fault addresses stored in the updated fault spare address unit 203 (S560). The repair is possible when the number of the fault addresses stored in the updated fault real address unit 202 is less than or equal to a value obtained by subtracting the number of the fault addresses stored in the fault spare address unit 103 from the total depth of the updated fault spare address unit 203 (=the total number of the spare addresses), that is, the number of available addresses of the updated fault spare address unit 203. If it is confirmed that the repair is impossible, no more operation is performed and the corresponding SRAM can be discarded.

Figure 5:
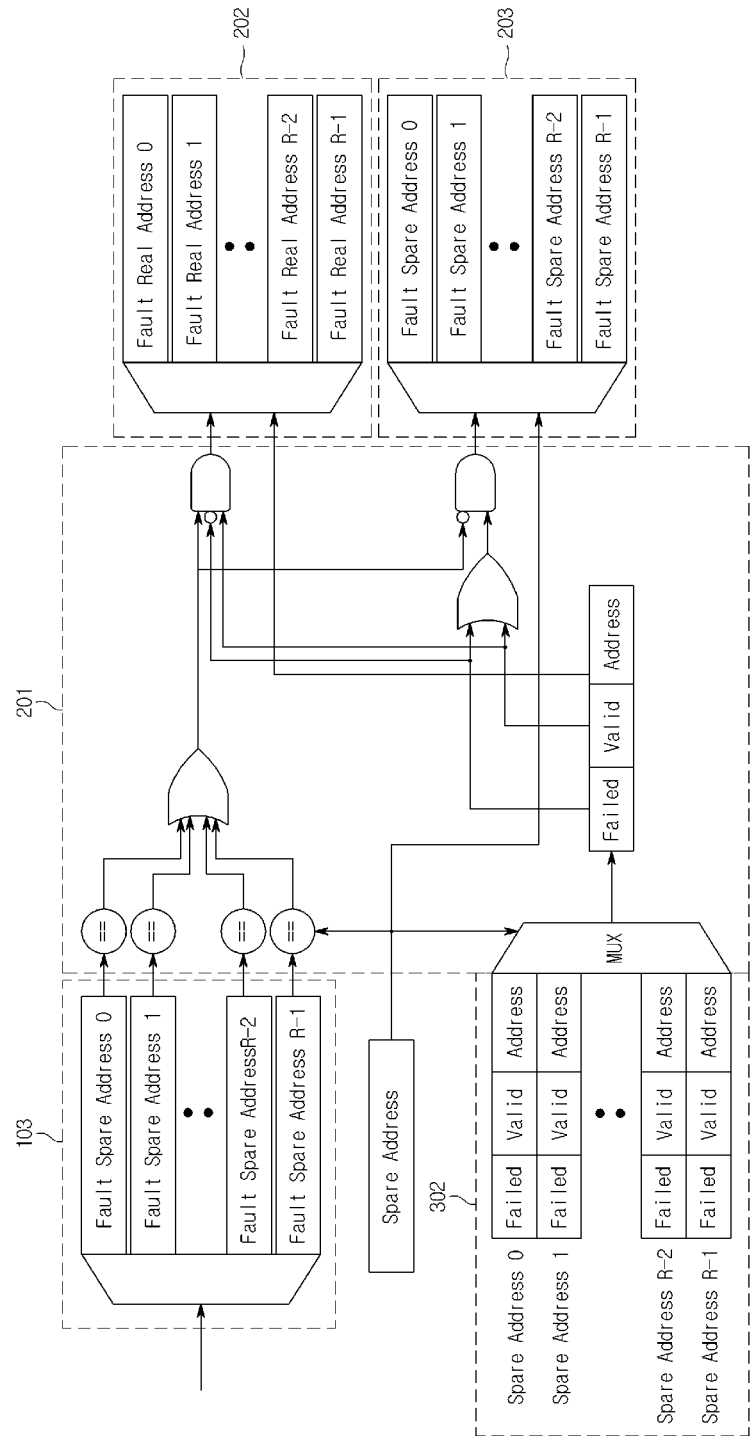
FIG. 5 is a circuit diagram of an update unit which performs the operation of FIG. 4 according to the present disclosure.

FIG. 5 is a circuit diagram of the update unit 200 which performs the operation of FIG. 4 according to the present disclosure.

FIG. 5 shows an example of a circuit diagram in which the update control unit 201 updates the fault address information in the updated fault real address unit 202 and the updated fault spare address unit 203 by using a logic gate on the basis of information on the fault spare addresses 0 to R−1 stored in the fault spare address unit 103 and the repair information (Failed, Valid, Address values) of the spare addresses 0 to R−1 of the repair information field register on the command map 302. The specific operation of the circuit diagram of FIG. 5 is performed according to the logic flow shown in FIG. 4.

With the circuit diagram shown in FIG. 5, a repair address update process according to the flowchart of FIG. 4 may be performed, and Tables 5 to 13 below show changes in the values of the updated fault real address unit 202 and the updated fault spare address unit 203 in the repair address update process according to the present disclosure.

The first table in Tables 5 to 13 shows the repair information stored in the repair information field register on the command map 302 and the repair state of the entire spare address according to the repair information. The second table shows the values of the fault real address unit 102 and the fault spare address unit 103 generated through the operation of the BIST circuit unit 101. The third table shows the values of the updated fault real address unit 202 and the updated fault spare address unit 203 within the update unit 200. In the aspect, since the entire address range is from 0 to 107, the address is represented by a 7-bit address. Also, the address 127 (binary number 1111111) is an unused address, so it is designated and used as an invalid address in order to distinguish it from a valid address.

Also, in Tables 5 to 13, a mark of "*" before the address values of the updated fault real address unit 202 and the updated fault spare address unit 203 is added to clarify the updated value in each aspect.

TABLE 5

| Repair information field register of command map 302 | | | | Fault real address unit 102 | | Fault spare address unit 103 | | Updated fault real address unit 202 | | Updated fault spare address unit 203 | |
|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | *90 | 0 | *102 |
| 101 | Failed | 1 | 0 | 0 | 1 | 127 | 1 | 105 | 1 | 127 | 1 | *105 |
| 102 | Repaired | 0 | 1 | 12 | 2 | 127 | 2 | 101 | 2 | 127 | 2 | *101 |
| 103 | Repaired | 0 | 1 | 20 | 3 | 127 | 3 | 127 | 3 | 127 | 3 | 127 |
| 104 | Available | 0 | 0 | 0 | 4 | 127 | 4 | 127 | 4 | 127 | 4 | 127 |
| 105 | Available | 0 | 0 | 0 | 5 | 127 | 5 | 127 | 5 | 127 | 5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 5 shows a result of step S520 according to the present disclosure.

As shown in the example of Table 5, in step S520, the update control unit 201 of the update unit 200 may store 90, that is, a valid fault address of the fault real address unit 102 and 102, 105, and 101, that is, a valid fault addresses of the fault spare address unit 103 in the updated fault real address unit 202 and the updated fault spare address unit 203, respectively. The update control unit 201 can sequentially approach the repair information for each spare address of the repair information field register of the command map 302 and reflect the repair information of the previous test in the updated fault real address unit 202 and the updated fault spare address unit 203.

TABLE 6

| Repair information field register of command map 302 | | | | Fault real address unit 102 | | Fault spare address unit 103 | | Updated fault real address unit 202 | | Updated fault spare address unit 203 | |
|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | 90 | 0 | 102 |
| 101 | Failed | 1 | 0 | 0 | 1 | 127 | 1 | 105 | 1 | 127 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | *100 |
| 104 | Available | 0 | 0 | 0 | 4 | 127 | 4 | 127 | 4 | 127 | 4 | 127 |
| 105 | Available | 0 | 0 | 0 | 5 | 127 | 5 | 127 | 5 | 127 | 5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 6 shows a result of the operation in which the update control unit 201 updates the first spare address.

In the example shown in Table 6, the update control unit 201 may confirm that the repair state of the spare address 100 is the "Repaired" state by the previous test according to step S540, and may confirm that the spare address 100 is not present in the fault spare address unit 103 of the BIST block unit 100 according to step S550. This means that the spare address 100 has normally passed (PASS) the current test.

However, the spare address 100 has been already used for repair. Therefore, in order that the spare address 100 is not used in the repair operation which assigns a spare address to be replaced for the fault real address, the update control unit 201 can add the spare address 100 to the updated fault spare address unit 203 (S562). Accordingly, there exist the spare addresses 102, 105, 101, and 100 in the updated fault spare address unit 203.

TABLE 7

| Repair information field register of command map 302 | | | | | Fault real address unit 102 | | Fault spare address unit 103 | | Updated fault real address unit 202 | | Updated fault spare address unit 203 | |
|---|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | *90 | 0 | 102 |
| 101 | Failed | 1 | 0 | 0 | 1 | 127 | 1 | 105 | 1 | 127 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | 100 |
| 104 | Available | 0 | 0 | 0 | 4 | 127 | 4 | 127 | 4 | 127 | ->4 | 127 |
| 105 | Available | 0 | 0 | 0 | 5 | 127 | 5 | 127 | 5 | 127 | 5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 7 shows a result of the operation in which the update control unit 201 updates the second spare address.

In the example shown in Table 7, the update control unit 201 may confirm that the repair state of the spare address 101 is the "Failed" state according to step S540, and may confirm that the spare address 101 is present in the fault spare address unit 103 according to step S550. This means that the spare address 101 is determined to be fault even in the current test of the BIST block unit 100 and is present in the fault spare address unit 103, and as a result, the spare address 101 is stored in the updated fault spare address unit 203 according to step S520. Therefore, the update control unit 201 does not need to further update the updated fault spare address unit 203.

TABLE 8

| Repair information field register of command map 302 | | | | | Fault real address unit 102 | | Fault spare address unit 103 | | Updated fault real address unit 202 | | Updated fault spare address unit 203 | |
|---|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | 90 | 0 | 102 |
| 101 | Failed | 1 | 0 | 0 | 1 | 127 | 1 | 105 | 1 | *12 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | 100 |
| 104 | Available | 0 | 0 | 0 | 4 | 127 | 4 | 127 | 4 | 127 | 4 | 127 |
| 105 | Available | 0 | 0 | 0 | 5 | 127 | 5 | 127 | 5 | 127 | 5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 8 shows a result of the operation in which the update control unit 201 updates the third spare address.

In the example shown in Table 8, the update control unit 201 may confirm that the repair state of the spare address 102 is the "Repaired" state by the previous test according to step S540, and may confirm that the spare addresses 102 is determined to be fault in the test in the BIST block unit 100 according to step S550 and is present in the fault spare address unit 103. Therefore, since a fault has occurred (FAIL) in the current test in the spare address 102 used for repair, a real address 12 must be repaired again. The update control unit 201 adds the real address 12, which is an "Address" field value of the spare address 102, to the updated fault real address unit 202 by step S561. As a result, there are real addresses 90 and 12 in the updated fault real address unit 202.

TABLE 9

| Repair information field register of command map 302 | | | | Fault real address unit 102 | | Fault spare address unit 103 | | Updated fault real address unit 202 | | Updated fault spare address unit 203 | |
|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | 90 | 0 | 102 |
| 101 | Failed | 1 | 0 | 0 | 1 | 127 | 1 | 105 | 1 | 12 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | 100 |
| 104 | Available | 0 | 0 | 0 | 4 | 127 | 4 | 127 | 4 | 127 | 4 | *103 |
| 105 | Available | 0 | 0 | 0 | 5 | 127 | 5 | 127 | 5 | 127 | 5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 9 shows a result of the operation in which the update control unit 201 updates the fourth spare address.

In the example shown in Table 9, the update control unit 201 may confirm that the repair state of the spare address 103 is the "Repaired" state by the previous test according to step S540, and may confirm that the spare addresses 103 passes (PASS) the current test in the BIST block unit 100 and is not present in the fault spare address unit 103 according to step S550. However, since the spare address 103 has been already used for repair, the update control unit 201 may add the spare address 103 to the updated fault spare address unit 203 according to step S562 in order that the spare address 103 is not used in the next repair. Thus, the updated fault spare address unit 203 includes the spare addresses 102, 105, 101, 100, and 103.

TABLE 10

| Repair information field register of command map 302 | | | | Fault real address unit 102 | | Fault spare address unit 103 | | Updated fault real address unit 202 | | Updated fault spare address unit 203 | |
|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | 90 | 0 | 102 |
| 101 | Failed | 1 | 0 | 0 | 1 | 127 | 1 | 105 | 1 | 12 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | 100 |
| 104 | Available | 0 | 0 | 0 | 4 | 127 | 4 | 127 | 4 | 127 | 4 | 103 |
| 105 | Available | 0 | 0 | 0 | 5 | 127 | 5 | 127 | 5 | 127 | ->5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 10 shows a result of the operation in which the update control unit 201 updates the fifth spare address.

In the example shown in Table 10, the update control unit 201 may confirm that the repair state of the spare address 104 is the "Available" state according to step S540. This means that the spare address 104 is normal and not used for repair. Further, the spare address 104 passes also the current test of the BIST block unit 100 and is not present in the fault spare address unit 103. Therefore, since the spare address 104 can be used for repair in the future, the update control unit 201 does not add the spare address 104 to the updated fault spare address unit 203.

TABLE 11

| Repair information field register of command map 302 | | | | | Fault real address unit 102 | | Fault spare address unit 103 | | Updated fault real address unit 202 | | Updated fault spare address unit 203 | |
|---|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | 90 | 0 | 102 |
| 101 | Failed | 1 | 0 | 0 | 1 | 127 | 1 | 105 | 1 | 12 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | 100 |
| 104 | Available | 0 | 0 | 0 | 4 | 127 | 4 | 127 | 4 | 127 | 4 | 103 |
| 105 | Available | 0 | 0 | 0 | 5 | 127 | 5 | 127 | 5 | 127 | 5 | 127 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 11 shows a result of the operation in which the update control unit 201 updates the sixth spare address.

In the example shown in Table 11, the update control unit 201 may confirm that the repair state of the spare address 105 is the "Available" state according to step S540. This means that the spare address 105 is normal and not used for repair. However, the spare address 105 is determined to be fault in the current test and is present in the fault spare address unit 103 of the BIST block unit 100. As a result, the spare address 105 is already present in the updated fault spare address unit 203 according to step S520, and in the future the spare address 105 is not used to replace the real address in the repair operation. Therefore, the update control unit 201 does not perform additional operations on the spare address 105.

TABLE 12

| Repair information field register of command map 302 | | | | | Fault real address unit 102 | | Fault spare address unit 103 | | Updated fault real address unit 202 | | Updated fault spare address unit 203 | |
|---|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | 90 | 0 | 102 |
| 101 | Failed | 1 | 0 | 0 | 1 | 127 | 1 | 105 | 1 | 12 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | 100 |
| 104 | Available | 0 | 0 | 0 | 4 | 127 | 4 | 127 | 4 | 127 | 4 | 103 |
| 105 | Available | 0 | 0 | 0 | 5 | 127 | 5 | 127 | 5 | 127 | 5 | *106 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 12 shows a result of the operation in which the update control unit 201 updates the seventh spare address.

In the example shown in Table 12, the update control unit 201 may confirm that the repair state of the spare address 106 is the "Failed" state according to step S540. This means that a fault has occurred (FAIL) in the spare address 106 in the previous test. However, according to step S550, the update control unit 201 may confirm that the spare address 106 passes the current test and is not present in the fault spare address unit 103 of the BIST block unit 100. Since the spare address 106 which has passed the current test but has been in the "Failed" state in the previous test should not be used for repair in the future, the update control unit 201 adds the spare address 106 to the updated fault spare address unit 203 by step S562. Thus, the updated fault spare address unit 203 includes the spare addresses 102, 105, 101, 100, 103, and 106.

Figure 6:
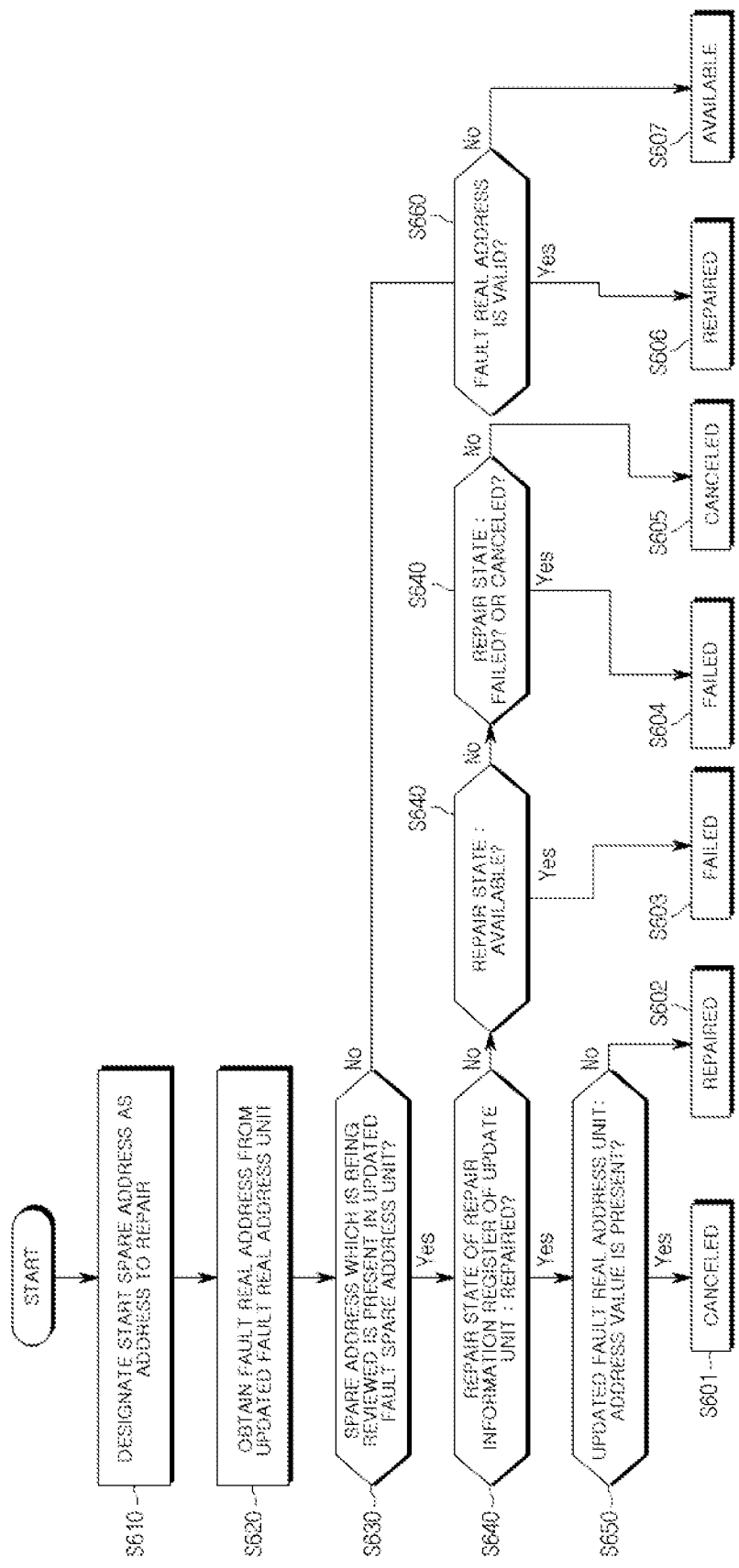
FIG. 6 is a flowchart showing a remapping operation of a remapping unit according to the present disclosure.

FIG. 6 is a flowchart showing a remapping operation of the remapping unit 300 according to the present disclosure.

The remapping control unit 301 can review from a start spare address with respect to the address to repair the fault real address (repair address) (S610).

The fault real address can be obtained from the updated fault real address unit 202 (S620). In the aspect of the present disclosure, the fault real address can be used by being divided into a valid fault real address and an invalid fault real address. The valid fault real address means an address which is within a normal range and is used by the memory. For example, if the entire address range is from 0 to 107, the valid fault real address is represented by a 7-bit address, and the address 127 (binary number 1111111) is an unused address, so that the address 127 can be designated and used as the invalid fault real address in order to distinguish it from the valid fault real address. If all the bits

TABLE 13

| Repair information field register of the command map 302 | | | | | Fault real address unit 102 | | Fault spare address unit 103 | | Updated fault real address unit 202 | | Updated fault spare address unit 203 | |
|---|---|---|---|---|---|---|---|---|---|---|---|---|
| Spare Address | Repair State | Failed | Valid | Address | Entry | Address | Entry | Address | Entry | Address | Entry | Address |
| 100 | Repaired | 0 | 1 | 45 | 0 | 90 | 0 | 102 | 0 | 90 | 0 | 102 |
| 101 | Failed | 1 | 0 | 0 | 1 | 127 | 1 | 105 | 1 | 12 | 1 | 105 |
| 102 | Repaired | 0 | 1 | 12 | 2 | 127 | 2 | 101 | 2 | 127 | 2 | 101 |
| 103 | Repaired | 0 | 1 | 20 | 3 | 127 | 3 | 127 | 3 | 127 | 3 | 100 |
| 104 | Available | 0 | 0 | 0 | 4 | 127 | 4 | 127 | 4 | 127 | 4 | 103 |
| 105 | Available | 0 | 0 | 0 | 5 | 127 | 5 | 127 | 5 | 127 | 5 | 106 |
| 106 | Failed | 1 | 0 | 0 | 6 | 127 | 6 | 127 | 6 | 127 | 6 | 127 |
| 107 | Available | 0 | 0 | 0 | 7 | 127 | 7 | 127 | 7 | 127 | 7 | 127 |

Table 13 shows a result of the operation in which the update control unit 201 updates the eighth spare address.

In the example shown in Table 13, the update control unit 201 may confirm that the repair state of the spare address 107 is the "Available" state according to step S540. This means that the spare address 107 has passed the previous test but is not used for repair. In addition, the spare address 107 may pass the current test of the BIST block unit 100 and may not exist in the fault spare address unit 103. Therefore, the spare address 107 can be used for repair in the future.

When the spare address 107 that is an end spare address is reached, according to step S560, the update unit 200 can determine whether or not the repair is possible on the basis of the number of fault addresses stored in the updated fault real address unit 202 and the updated fault spare address unit 203. In the aspect, six of a total of eight spare cells have been used for the "Repaired", "Failed", "Canceled" states, etc., through the updated fault spare address unit 203 in the finally updated address unit, and two spare cells can be used as a spare. In addition, since the update unit 200 needs to repair two real addresses through the updated fault real address unit 202, the update unit 200 can determine that "the repair is possible" (Repairable).

The remapping unit 300 can remap and update the repair information by using the information of the updated fault real address unit 202, the updated fault spare address unit 203, and the repair information register of the update unit 204, and can record the updated repair information in the repair information field register on the command map 302 (S600 shown in FIG. 2).

of the fault address are 1, the fault address is the invalid address. Therefore, the remapping control unit 301 may read the updated fault real address unit 202 until the valid address is found. In order to replace the fault real address with the spare address, the remapping control unit 301 may check whether or not the spare address being reviewed is present in the updated fault spare address unit 203 and distinguish whether the spare address is a bad SRAM cell (S630). When the spare address is present in the updated fault spare address unit 203, the remapping control unit 301 may check the repair information of the repair information register of the update unit 204 with respect to the spare address and remap the repair information, and record the remapped value with respect to the spare address in the repair information field register on the command map 302 (S640). When the spare address is not present in the updated fault spare address unit 203 and is a good SRAM cell, the remapping control unit 301 can repair the fault real address with the spare addresses (S606). Table 14 below shows operation conditions and operation contents of the remapping control unit 301 and shows information, i.e., condition, of the repair information register of the update unit 204 with respect to the spare address being reviewed for repair, whether the fault real address read from the updated fault real address unit 202 is valid or not, whether the spare address is present in the updated fault spare address unit 203 or not, whether the value of the original address of the spare address is present in the updated fault real address unit 202 or not, and operations in which the remapping control unit 301 changes or maintains the repair information of the command map 302.

TABLE 14

| Updated fault spare address unit 203 Presence of spare address | Updated fault real address unit 202 Valid | Repair information register of the update unit 204 Repair state | Failed | Valid | Updated fault real address unit 202 Presence of value of original address | Remapping control unit 301 Operation on command map 302 |
|---|---|---|---|---|---|---|
| 1 | — | Repaired | 0 | 1 | 1 | Change to canceled state (S601) |
| 1 | — | Repaired | 0 | 1 | 0 | Maintain repaired state (S602) |
| 1 | — | Available | 0 | 0 | — | Change to failed state (S603) |
| 1 | — | Failed | 1 | 0 | — | Maintaining failed state (S604) |
| 1 | — | Canceled | 1 | 1 | — | Maintain canceled state (S605) |
| 0 | 1 | Available | 0 | 0 | — | Change to repaired state (S606) |
| 0 | 0 | Available | 0 | 0 | — | Maintain available state (S607) |

When the spare address being reviewed for replacing the fault real address read from the updated fault real address unit 202 is present in the updated fault spare address unit 203 and when the repair information of the repair information register of the update unit 204 for the corresponding spare address is in the "Repaired" state and when the value of the "Address" field of the repair information register of the update unit 204 for the corresponding spare address is present in the updated fault real address unit 202, the corresponding spare address indicates a bad SRAM cell. Since a fault occurs through the BIST test at the spare address used for repair, the remapping control unit 301 may maintain the "Valid" and "Address" (original address) fields of the repair information field register on the command map 302 for the corresponding spare address as they are, and set the "Failed" field to 1. Accordingly, the repair state of the corresponding spare address which has been replaced for repair and used may be the "Canceled" state (S601).

When the spare address being reviewed for replacing the fault real address read from the updated fault real address unit 202 is present in the updated fault spare address unit 203 and when the repair information of the repair information register of the update unit 204 for the corresponding spare address is in the "Repaired" state and when the value of the "Address" field of the repair information register of the update unit 204 for the corresponding spare address is not present in the updated fault real address unit 202, the corresponding spare address indicates a good SRAM cell and is replaced and used. The remapping control unit 301 may maintain all fields of the repair information field register on the command map 302 for the corresponding spare address as they are, so that the repair state can be maintained as the "Repaired" state (S602).

When the spare address being reviewed for replacing the fault real address read from the updated fault real address unit 202 is present in the updated fault spare address unit 203 and when the repair information of the repair information register of the update unit 204 for the corresponding spare address is in the "Available" state, the corresponding spare address indicates a bad SRAM cell. Since "Failed" has occurred at the corresponding spare address through the current BIST test and the repair state of the repair information register of the update unit 204 for that spare address is "Available", the remapping control unit 301 can change the repair state of the repair information field register on the command map 302 for the corresponding spare address into the "Failed" state (S603).

When the spare address being reviewed for replacing the fault real address read from the updated fault real address unit 202 is present in the updated fault spare address unit 203 and when the repair information of the repair information register of the update unit 204 for the corresponding spare address is in the "Failed" state, the corresponding spare address indicates a bad SRAM cell. The remapping control unit 301 can maintain all fields of the repair information field register on the command map 302 for the corresponding spare address as they are, so that the repair state can be maintained as the "Failed" state (S604).

When the spare address being reviewed for replacing the fault real address read from the updated fault real address unit 202 is present in the updated fault spare address unit 203 and when the repair information of the repair information register of the update unit 204 for the corresponding spare address is in the "Canceled" state, the corresponding spare address indicates a bad SRAM cell. The remapping control unit 301 may maintain all fields of the repair information field register on the command map 302 for the corresponding spare address as they are, so that the repair state can be maintained as the "Canceled" state (S605).

When the spare address being reviewed for replacing the fault real address read from the updated fault real address unit 202 is not present in the updated fault spare address unit 203, the corresponding spare address indicates a good SRAM cell. If the address read from the updated fault real address unit 202 is a valid fault real address (S660), the remapping control unit 301 may record the corresponding fault real address in the "Address" field in the repair information field register on the command map 302 for the corresponding spare address, set the "Valid" field to 1 and the "Failed" field to 0, respectively, and change the repair state of the spare address into the "Repaired" state (S606). As a result, when the corresponding fault real address is accessed, the fault real address is replaced with a designated spare address and repair is performed.

When the read address is not valid because there is no more valid address in the updated fault real address unit 202, if the spare address being reviewed is not present in the updated fault spare address unit 203, the corresponding spare address indicates a good SRAM cell. If the address read from the updated fault real address unit 202 is an invalid fault real address (S660), the remapping control unit 301 can record all fields in the repair information field register on the command map 302 for the corresponding spare address as 0. That is, the "Available" state can be maintained (S607).

Figure 7:
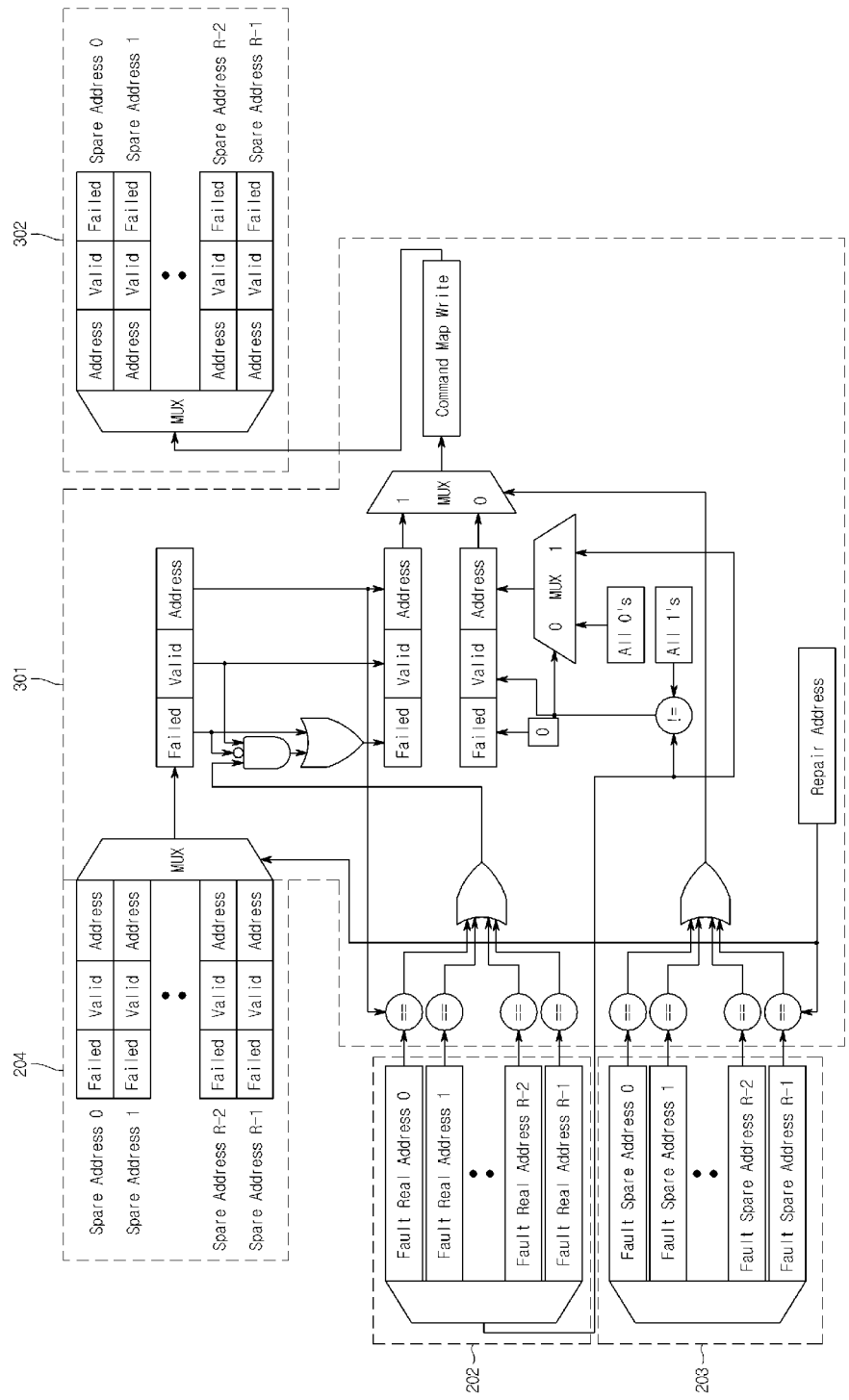
FIG. 7 is a circuit diagram of the SRAM test apparatus which performs the operation of FIG. 6 according to the present disclosure.

FIG. 7 is a circuit diagram of the SRAM test apparatus which performs the operation of FIG. 6 according to the present disclosure.

FIG. 7 shows an example of a circuit diagram in which the remapping control unit 301 performs a repair by using a logic gate on the basis of the repair information (Failed, Valid, Address values) of the spare addresses 0 to R−1 of the repair information register of the update unit 204, information of the fault real addresses 0 to R−1 stored in the updated fault real address unit 202, and information of the fault spare addresses 0 to R−1 stored in the updated fault spare address unit 203, and records it in the spare addresses 0 to R−1 of the repair information field register on the command map 302. The specific operation of the circuit diagram of FIG. 7 is performed according to the logic flow shown in FIG. 6.

Tables 15 to 23 show an automatic remapping process of step S600 according to the present disclosure.

Tables 15 to 23 are aspects of step S600 of remapping by using the result values of Table 13 according to an aspect of updating step S500.

The first table in Tables 15 to 23 shows the repair information of the repair information register of the update unit 204 which has stored the repair information of the previous test from the command map 302 and the repair state of the entire spare address according to the repair information. Also, the second table shows the values of the updated fault spare address unit 203 and the updated fault real address unit 202 generated through step S500 according to the results of the Table 13. Also, the third table shows the repair information which is to be remapped by step S600 and is stored in the repair information field register on the command map 302, and the repair state of the entire spare address according to the repair information.

In the aspect, what the repair state is set to "Available" means that, among the repair information of the repair information field register of the command map 302, the "Failed" field is set to 0 and the "Valid" field is set to 0.

Also, in the aspect, what the repair state is set to "Repaired" means that, among the repair information of the repair information field register of the command map 302, the "Failed" field is set to 0, the "Valid" field is set to 1, and the "Address" field is set to the fault real address.

Also, in the aspect, what the repair state is set to "Failed" means that, among the repair information of the repair information field register of the command map 302, the "Failed" field is set to 1 and the "Valid" field is set to 0.

Also, in the aspect, what the repair state is set to "Canceled" means that, among the repair information of the repair information field register of the command map 302, the "Failed" field is set to 1 and the "Valid" field is set to 1.

Also, in Tables 15 to 23, a mark of "*" before each value of the repair information field register of the command map 302 is added to clarify the remapped and changed value in each aspect.

TABLE 15

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare address | Repair state | Failed | Valid | Address | Entry | Address | Entry | Address | Spare address | Repair state | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | Repaired | 0 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | Available | 0 | 0 | 0 |
| 105 | Available | 0 | 0 | 0 | 5 | 127 | 5 | 106 | 105 | Available | 0 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | Available | 0 | 0 | 0 |

In the example shown in Table 15, according to step S610, the remapping control unit 301 may designate the spare address 100 that is a start spare address as the repair address and start the review. According to step S620, the remapping control unit 301 may read the fault real address from the updated fault real address unit 202. Here, the remapping control unit 301 may initialize "Entry" to 0 in order to read the fault address recorded at the first of the updated fault real address unit 202. According to the aspect of Table 15, the remapping control unit 301 may read a valid fault real address 90 from the updated fault real address unit 202. The remapping control unit 301 may check whether the spare address 100 being reviewed in step S630 is present in the updated fault spare address unit 203 or not. Since the spare address 100 is present in the updated fault spare address unit 203, the remapping control unit 301 performs step S640 to check the repair state of the spare address 100 from the repair information register of the update unit 204. Since the spare address 100 is in the "Repaired" state, the remapping control unit 310 can check whether the real address 45 that is an "Address" field value of the spare address 100 is present in the updated fault real address unit 202 according to step S650. Since there is no real address 45 in the updated fault real address unit 202, the remapping control unit 301 can maintain the repair state of the spare address 100 as the "Repaired" state according to step S602.

TABLE 16

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare Address | Repair State | Failed | Valid | Address | Entry | Address | Entry | Address | Spare Address | Repair State | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | Repaired | 0 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | Available | 0 | 0 | 0 |
| 105 | Available | 0 | 0 | 0 | 5 | 127 | 5 | 106 | 105 | Available | 0 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | Available | 0 | 0 | 0 |

In the example shown in Table 16, the remapping control unit 301 may review the next spare address 101 in order to find a spare address to repair the real address 90 read from the updated fault real address unit 202. The remapping control unit 301 may confirm that the corresponding spare address 101 is present in the updated fault spare address unit 203 in accordance with step S630 and confirm that the repair state of the spare address 101 is the "Failed" state in accordance with step S640. Accordingly, according to step S604, the remapping control unit 301 can maintain the repair state of the spare address 101 as the "Failed" state in the repair information field register of the command map 302.

accordance with step S630, confirm that the repair state of the spare address 102 is the "Repaired" state in accordance with step S640, and confirm that the real address 12 that is the "Address" field value of the spare address 102 is present in the updated fault real address unit 202 in accordance with the step S650. Accordingly, in accordance with step S601, the remapping control unit 301 can change the repair state into the "Canceled" state by changing the "Failed" field of the spare address 102 into 1 in the repair information field register on the command map 302.

TABLE 17

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare Address | Repair State | Failed | Valid | Address | Entry | Address | Entry | Address | Spare Address | Repair State | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | *Canceled | *1 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | Available | 0 | 0 | 0 |
| 105 | Available | 0 | 0 | 0 | 5 | 127 | 5 | 106 | 105 | Available | 0 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | Available | 0 | 0 | 0 |

In the example shown in Table 17, the remapping control unit 301 may review the next spare address 102 in order to find a spare address to repair the real address 90 read from the updated fault real address unit 202. The remapping control unit 301 may confirm that the spare address 102 is present in the updated fault spare address unit 203 in

TABLE 18

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare Address | Repair State | Failed | Valid | Address | Entry | Address | Entry | Address | Spare Address | Repair State | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | Canceled | 1 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | Available | 0 | 0 | 0 |
| 105 | Available | 0 | 0 | 0 | 5 | 127 | 5 | 106 | 105 | Available | 0 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | Available | 0 | 0 | 0 |

In the example shown in Table 18, the remapping control unit 301 may review the next spare address 103 in order to find a spare address to repair the real address 90 read from the updated fault real address unit 202. The remapping control unit 301 may confirm that the corresponding spare address 103 is present in the updated fault spare address unit 203 in accordance with step S630, confirm that the repair state of the spare address 103 is the "Repaired" state in accordance with step S640, and confirm that the real address 20 that is the "Address" field value of the spare address 103 is not present in the updated fault real address unit 202 in accordance with the step S650. Accordingly, according to step S602, the remapping control unit 301 can maintain the repair state of the spare address 103 as the "Repaired" state in the repair information field register on the command map 302.

In the example shown in Table 20, according to step S620, the remapping control unit 301 may read the valid fault real address 12 from the updated fault real address unit 202. The remapping control unit 301 may review the next spare address 105 in order to find a spare address to repair the real address 12. The remapping control unit 301 may confirm that the spare address 105 is present in the updated fault spare address unit 203 in accordance with step S630 and confirm that the repair state of the spare address 105 is the "Available" state in accordance with step S640. Accordingly, according to step S603, the remapping control unit 301 can change the repair state into the "Failed" state by changing the "Failed" field of the spare address 105 into 1 in the repair information field register on the command map 302.

TABLE 19

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare Address | Repair State | Failed | Valid | Address | Entry | Address | Entry | Address | Spare Address | Repair State | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | Canceled | 1 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | *Repaired | 0 | *1 | *90 |
| 105 | Available | 0 | 0 | 0 | 5 | 127 | 5 | 106 | 105 | Available | 0 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | Available | 0 | 0 | 0 |

In the example shown in Table 19, the remapping control unit 301 may review the next spare address 104 in order to find a spare address to repair the real address 90 read from the updated fault real address unit 202. The remapping control unit 301 may confirm that the spare address 104 is not present in the updated fault spare address unit 203 in accordance with step S630. Accordingly, according to step S606, the remapping control unit 301 may designate the spare address 104 as a spare address to repair the fault real address 90. The remapping control unit 301 may set the "Valid" field of the spare address 104 to 1 in the repair information field register on the command map 302, record the repair state as the "Repaired" state, and record the "Address" field as 90.

TABLE 20

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare Address | Repair State | Failed | Valid | Address | Entry | Address | Entry | Address | Spare Address | Repair State | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | Canceled | 1 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | Repaired | 0 | 1 | 90 |
| 105 | Available | 0 | 0 | 0 | 5 | 127 | 5 | 106 | 105 | *Failed | *1 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | Available | 0 | 0 | 0 |

TABLE 21

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare Address | Repair State | Failed | Valid | Address | Entry | Address | Entry | Address | Spare Address | Repair State | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | Canceled | 1 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | Repaired | 0 | 1 | 90 |
| 105 | Available | 0 | 0 | 0 | 5 | 127 | 5 | 106 | 105 | Failed | 1 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | Available | 0 | 0 | 0 |

In the example shown in Table 21, the remapping control unit 301 may review the next spare address 106 in order to find a spare address to repair the real address 12 read from the updated fault real address unit 202. The remapping control unit 301 may confirm that the spare address 106 is present in the updated fault spare address unit 203 in accordance with step S630 and confirm that the repair state of the spare address 106 is the "Failed" state in accordance with step S640. Accordingly, according to step S604, the remapping control unit 301 can maintain the repair state of the spare address 106 as the "Failed" state in the repair information field register on the command map 302.

TABLE 22

| Repair information register of the update unit 204 | | | | | Updated fault real address unit 202 | | Updated fault spare address unit 203 | | Repair information field register of command map 302 | | | | |
|---|---|---|---|---|---|---|---|---|---|---|---|---|---|
| Spare Address | Repair State | Failed | Valid | Address | Entry | Address | Entry | Address | Spare Address | Repair State | Failed | Valid | Address |
| 100 | Repaired | 0 | 1 | 45 | 0 | 90 | 0 | 102 | 100 | Repaired | 0 | 1 | 45 |
| 101 | Failed | 1 | 0 | 0 | 1 | 12 | 1 | 105 | 101 | Failed | 1 | 0 | 0 |
| 102 | Repaired | 0 | 1 | 12 | 2 | 127 | 2 | 101 | 102 | Canceled | 1 | 1 | 12 |
| 103 | Repaired | 0 | 1 | 20 | 3 | 127 | 3 | 100 | 103 | Repaired | 0 | 1 | 20 |
| 104 | Available | 0 | 0 | 0 | 4 | 127 | 4 | 103 | 104 | Repaired | 0 | 1 | 90 |
| 105 | Available | 0 | 0 | 0 | 5 | 127 | 5 | 106 | 105 | Failed | 1 | 0 | 0 |
| 106 | Failed | 1 | 0 | 0 | 6 | 127 | 6 | 127 | 106 | Failed | 1 | 0 | 0 |
| 107 | Available | 0 | 0 | 0 | 7 | 127 | 7 | 127 | 107 | *Repaired | 0 | *1 | *12 |

In the example shown in Table 22, the remapping control unit 301 may review the spare address 107 in order to find a spare address to repair the real address 12 read from the updated fault real address unit 202. The remapping control unit 301 may confirm that the spare address 107 is not present in the updated fault spare address unit 203 in accordance with step S630, and the spare address 107 can be used for repair. Accordingly, according to step S606, the remapping control unit 301 may set the "Valid" field of the spare address 107 to 1 in the repair information field register on the command map 302 and then change the repair state into the "Repaired" state, and record the "Address" field as 12. Also, since the end spare address has been reached, the automatic remapping operation can be terminated.

TABLE 23

| Repair information register of the update unit 204 | | | | | Repair information field register of command map 302 | | | | |
|---|---|---|---|---|---|---|---|---|---|
| Spare Address | Repair State | Failed | Valid | Address | Spare Address | Repair State | Failed | Valid | Address |
| 100 | Repaired | 0 | 1 | 45 | 100 | Repaired | 0 | 1 | 45 |
| 101 | Failed | 1 | 0 | 0 | 101 | Failed | 1 | 0 | 0 |
| 102 | Repaired | 0 | 1 | 12 | 102 | Canceled | 1 | 1 | 12 |
| 103 | Repaired | 0 | 1 | 20 | 103 | Repaired | 0 | 1 | 20 |
| 104 | Available | 0 | 0 | 0 | 104 | Repaired | 0 | 1 | 90 |

TABLE 23-continued

| Repair information register of the update unit 204 | | | | | Repair information field register of command map 302 | | | | |
|---|---|---|---|---|---|---|---|---|---|
| Spare Address | Repair State | Failed | Valid | Address | Spare Address | Repair State | Failed | Valid | Address |
| 105 | Available | 0 | 0 | 0 | 105 | Failed | 1 | 0 | 0 |
| 106 | Failed | 1 | 0 | 0 | 106 | Failed | 1 | 0 | 0 |
| 107 | Available | 0 | 0 | 0 | 107 | Repaired | 0 | 1 | 12 |

Table 23 shows an example of the result of the command map 302 which has been finally updated by the remapping control unit 301 after performing the automatic remapping operation.

The memory unit 400 may store the repair information of the command map 302 in the non-volatile memory 402 or may provide the repair information stored in the non-volatile memory 402 to the command map 302 (S700 shown in FIG. 2).

The memory control unit 401 may store, in the non-volatile memory 402, the value of the repair information field register for each spare address stored in the command map 302. When the display driver IC is powered on or performs an operation, the memory control unit 401 may read the repair information stored in the non-volatile memory 402 and store it in the command map 302.

The non-volatile memory 402 may be an OTP which can be overwritten, a flash memory, etc., according to the present disclosure.

The method and apparatus proposed in the present disclosure may be provided as a separate apparatus according to the present disclosure. However, according to another aspect, the method and apparatus can be implemented in software or hardware as a module embedded in an apparatus using SRAM such as a display, a TV, or the like.

It will be apparent to those skilled in the art that various modifications and variations can be made in the static random-access memory (SRAM) fault handling apparatus and the SRAM fault handling method of the present disclosure without departing from the spirit or scope of the present disclosure. Thus, it is intended that the present disclosure covers the modifications and variations of the present disclosure provided they come within the scope of the appended claims and their equivalents.

What is claimed is:

1. A fault handling apparatus for a static random-access memory (SRAM) including a real memory area and a spare memory area, comprising:
   a memory unit configured to store repair information;
   a command map configured to obtain the repair information of a previous test from the memory unit and provide the repair information of the previous test;
   a built-in self-test (BIST) block unit configured to obtain the repair information of the previous test from the command map, perform a fault test on an entire address of a SRAM cell, distinguishes whether a fault address where a fault has occurred is a real address or a spare address, and store fault address information related to the fault address;
   an update unit configured to update the fault address information by using the repair information of the previous test obtained from the command map and the fault address information obtained from the BIST block unit; and
   a remapping control unit configured to update the repair information by remapping the repair information based on the repair information of the previous test and the updated fault address information obtained from the update unit, and transmit the updated repair information to the command map,
   wherein the command map configured to obtain the updated repair information and store in the memory unit.

2. The fault handling apparatus according to claim 1, wherein the BIST block unit configured to store the fault address information in a fault real address unit when the fault address is the real address, or store the fault address information in a fault spare address unit when the fault address is the spare address.

3. The fault handling apparatus according to claim 2, wherein the update unit configured to store the repair information of the previous test obtained from the command map in a repair information register of the update unit, store the fault address information of the fault real address unit in an updated fault real address unit, and store the fault address information of the fault spare address unit in an updated fault spare address unit.

4. The fault handling apparatus according to claim 3, wherein the repair information for each of the spare address includes:
   a repair state showing one of a repaired state, an available state, a failed state, and a canceled state; and
   a value of an original address which is a real address repaired by each of the spare address.

5. The fault handling apparatus according to claim 4, wherein, when the repair state of the spare address obtained from the command map is in the repaired state and the spare address is present in the fault spare address unit, the update unit configured to store the value of the original address of the spare address in the updated fault real address unit, and
   when the repair state of the spare address obtained from the command map is in the repaired state and the spare address is not present in the fault spare address unit, the update unit configured to store the spare address in the updated fault spare address unit.

6. The fault handling apparatus according to claim 4, wherein, when the repair state of the spare address obtained from the command map is in either the failed state or the canceled state and the spare address is not present in the fault spare address unit, the update unit configured to store the spare address in the updated fault spare address unit.

7. The fault handling apparatus according to claim 4, wherein, when the number of the fault addresses stored in the updated fault real address unit is less than or equal to the number of the available addresses calculated based on the number of the fault addresses stored in the updated fault spare address unit, the update unit configured to determine if the repair is possible.

8. The fault handling apparatus according to claim 4, wherein the remapping control unit configured to update the repair information by remapping each of the spare address in order to repair the fault real address in the updated fault real address unit based on the updated fault real address information obtained from the updated fault real address unit and the updated fault spare address information obtained from the updated fault spare address unit and the repair information of the previous test of the spare address obtained from the repair information register of the update unit and transmit the updated repair information to the command map.

9. The fault handling apparatus according to claim 8, wherein, when the spare address is present in the updated fault spare address unit, the repair state of the spare address is in the repaired state and the value of the original address of the spare address is present in the updated fault real address unit, the remapping control unit configured to change the repair state of the spare address into the canceled state, and when the spare address is present in the updated fault spare address unit, and the repair state of the spare address is in the repaired state and the value of the original address of the spare address is not present in the updated fault real address unit, the remapping control unit configured to maintain the repair state of the spare address as the repaired state.

10. The fault handling apparatus according to claim 8, wherein, when the spare address is present in the updated fault spare address unit and the repair state of the spare address is in the available state, the remapping control unit configured to change the repair state of the spare address into the failed state in the command map, wherein, when the spare address is present in the updated fault spare address unit and the repair state of the spare address is in the failed state, the remapping control unit configured to maintain the repair state of the spare address as the failed state in the command map, and wherein, when the spare address is present in the updated fault spare address unit and the repair state of the spare address is in the canceled state, the remapping control unit configured to maintain the repair state of the spare address as the canceled state in the command map.

11. The fault handling apparatus according to claim 8, wherein, when the spare address is not present in the updated fault spare address unit and the updated fault real address is a valid address within a range of the real address, the remapping control unit configured to change the repair state of the spare address into the repaired state in the command map, and records the updated fault real address in the original address, and when the spare address is not present in the updated fault spare address unit and the updated fault real address is an invalid address outside the range of the real address, the remapping control unit configured to maintain the repair state of the spare address as the available state in the command map.

12. The fault handling apparatus according to claim 1, wherein the BIST block unit configured to exclude, from the fault test, an already repaired address among the real address based on the repair information of the previous test obtained from the command map, and perform the fault test on a repaired and replaced spare address.

13. The fault handling apparatus according to claim 1, further comprising an address remapping table configured to output a normal spare address replaced for the fault real address, when performing a SRAM write/read access based on the repair information of the previous test or the updated repair information from the command map.

14. A method of handling a fault of a static random-access memory (SRAM) including a real memory area and a spare memory area, the method comprising:

reading repair information of a previous test stored in a memory unit;

providing the repair information of the previous test to a built-in self-test (BIST) circuit;

performing a fault test on entire address of an SRAM cell by the BIST circuit;

when a fault occurs during the fault testing, determining whether the fault has occurred is a real address or a spare address, and storing fault address information related to the fault address;

updating the fault address information by using the fault address information and the repair information of the previous test;

updating the repair information based on the updated fault address information and the repair information of the previous test and transmit the updated repair information to a command map; and storing the updated repair information in the memory unit.

15. The method according to claim 14, wherein the storing of the fault address information comprises:

storing the fault address information in a fault real address unit when the fault address is the real address; and storing the fault address information in a fault spare address unit when the fault address is the spare address.

16. The fault handling method according to claim 15, wherein the updating of the fault address information comprises:

storing the repair information of the previous test in the command map of a remapping unit;

storing the fault address information of the fault real address unit in an updated fault real address unit, and storing the fault address information of the fault spare address unit in an updated fault spare address unit;

checking whether the repair is possible or not by comparing the number of the fault address information of the fault real address unit and the number of the fault address information of the fault spare address unit; and updating the updated fault real address unit and the updated fault spare address unit by using the repair information of the previous test, the fault address information in the fault real address unit, and the fault address information in the fault spare address unit.

17. The fault handling method according to claim 16, wherein the repair information for each of the spare address comprises:

a repair state showing one of a repaired state, an available state, a failed state, and a canceled state; and a value of an original address which is a real address repaired by the each of the spare address.

18. The fault handling method according to claim 17, wherein the updating of the updated fault real address unit and the updated fault spare address unit comprises:

storing the value of the original address of the spare address in the updated fault real address unit when the repair state of the spare address to be updated is in the repaired state and the spare address is present in the fault spare address unit; and storing the spare address in the updated fault spare address unit when the repair state of the spare address to be updated is in the repaired state and the spare address is not present in the fault spare address unit.

19. The fault handling method according to claim 17, wherein the updating of the updated fault real address unit and the updated fault spare address unit comprises:
storing the spare address in the updated fault spare address unit when the repair state of the spare address to be updated is in either the failed state or the canceled state and the spare address is not present in the fault spare address unit.

20. The fault handling method according to claim 17, wherein the updating of the repair information comprises:
reviewing from a start address of the spare address;
obtaining the fault real address from the updated fault real address unit; and
updating the repair information by remapping each of the spare address in order to repair the fault real address based on the repair information of the previous test of the spare address and the updated fault spare address information obtained from the updated fault spare address unit.

21. The fault handling method according to claim 20, wherein the remapping of the each of the spare address comprises:
changing the repair state of the spare address into the canceled state when the spare address is present in the updated fault spare address unit, the repair state of the spare address is in the repaired state and the value of the original address of the spare address is present in the updated fault real address unit; and
maintaining the repair state of the spare address as the repaired state when the spare address is present in the updated fault spare address unit, the repair state of the spare address is in the repaired state and the value of the original address of the spare address is not present in the updated fault real address unit.

22. The fault handling method according to claim 20, wherein the remapping of each of the spare address comprises:
changing the repair state of the spare address into the failed state when the spare address is present in the updated fault spare address unit and the repair state of the spare address is in the available state;
maintaining the repair state of the spare address as the failed state when the spare address is present in the updated fault spare address unit and the repair state of the spare address is in the failed state; and
maintaining the repair state of the spare address as the canceled state when the spare address is present in the updated fault spare address unit and the state of the spare address is in the canceled state.

23. The fault handling method according to claim 20, wherein the remapping of each of the spare address comprises:
changing the repair state of the spare address into the repaired state and recording the fault real address as the value of the original address when the spare address is not present in the updated fault spare address unit and the fault real address obtained from the updated fault real address unit is a valid address within a range of the real address; and
maintaining the repair state of the spare address as the available state when the spare address is not present in the updated fault spare address unit and the fault real address obtained from the updated fault real address unit is an invalid address outside the range of the real address.

24. The fault handling method according to claim 16, wherein the checking whether the repair is possible or not comprises:
determining that the repair is possible when the number of the fault addresses stored in the fault real address unit is less than or equal to the number of available addresses calculated based on the number of the fault addresses stored in the fault spare address unit.

25. The SRAM fault handling method according to claim 14, wherein the performing of the fault test comprises excluding, from the fault test, an address which has been already repaired among the real address in the previous test based on the repair information of the previous test, and performing the fault test on a repaired and replaced spare address.

26. The fault handling method according to claim 14, further comprising outputting a normal spare address repaired the fault real address when performing a SRAM write/read, based on the updated repair information or the repair information of the previous test.

* * * * *